United States Patent [19]

Kempf et al.

[11] Patent Number: 4,945,020

[45] Date of Patent: Jul. 31, 1990

[54] PHOTOSENSITIVE LEUCO DYE CONTAINING ELECTROSTATIC MASTER WITH PRINTOUT IMAGE

[75] Inventors: Richard J. Kempf, Towanda, Pa.; Rolf Dessauer, Greenville; Steven C. Freilich, Wilmington, both of Del.

[73] Assignee: E. I. Du Pont de Nemours and Company, Wilmington, Del.

[21] Appl. No.: 374,491

[22] Filed: Jun. 30, 1989

[51] Int. Cl.$^5$ .................... G03G 13/32; G03F 7/20
[52] U.S. Cl. ........................ 430/49; 430/56; 430/73; 430/76
[58] Field of Search .................... 430/49, 56, 73, 76

[56] References Cited

U.S. PATENT DOCUMENTS

| | | | |
|---|---|---|---|
| 3,310,401 | 3/1967 | Greig | 430/31 |
| 3,598,592 | 8/1971 | Cescon | 430/31 |
| 4,111,692 | 9/1978 | Etoh | 430/31 |
| 4,311,783 | 1/1982 | Dessauer | 430/270 |
| 4,634,657 | 1/1987 | Hollman, III | 430/281 |
| 4,859,551 | 8/1989 | Kempf et al. | 430/49 |

*Primary Examiner*—J. David Welsh

[57] ABSTRACT

High resolution, photosensitive electrostatic master which is positive-working with a single imagewise exposure comprising a conductive support bearing a layer of a photosensitive composition consisting essentially of (A) at least one polymeric binder, (B) a hexaarylbiimidazole photooxidant, (C) leuco dye, preferably stabilized, oxidized by (B), (D) a nonionic halogenated compound, preferably a hydrocarbon, and (E) compatible plasticizer. A process of making positive images by a single imagewise exposure is described. The master is useful in making proofs that duplicate the image achieved by printing, etc.

42 Claims, No Drawings

PHOTOSENSITIVE LEUCO DYE CONTAINING ELECTROSTATIC MASTER WITH PRINTOUT IMAGE

TECHNICAL FIELD

This invention relates to a photosensitive electrostatic master. More particularly, this invention relates to a photosensitive electrostatic master capable of producing positive images from a single imagewise exposure.

BACKGROUND OF THE INVENTION

Photopolymerizable compositions and films or elements containing binder, monomer, initiator and chain transfer agent are available commercially. One important application of such photopolymerizable elements is in the graphic arts field. Elements containing such photopolymerizable layers are currently being used as electrostatic masters for analog color proofing and are considered as promising future materials to be developed for digital color proofing applications. For the analog color proofing application, a photopolymerizable layer is coated on an electrically conductive substrate and contact exposed with an ultraviolet (UV) source through a halftone color separation negative. The photopolymerizable composition hardens in the areas exposed with an ultraviolet source due to polymerization and remains in an unexposed liquid-like state elsewhere. The differences in viscosity between the exposed and unexposed areas are apparent in the transport properties, i.e., the unexposed photopolymerizable areas conduct electrostatic charge while the exposed areas are nonconductive. By subjecting the imagewise exposed photopolymerized element to a corona discharge, a latent electrostatic image is obtained consisting of electrostatic charge remaining only in the nonconducting or exposed areas of the element. This latent image can then be developed by application of a electrostatic toner to the surface. When the toner has the opposite charge as the corona charge, the toner selectively adheres to the exposed or polymerized areas of the photopolymerized element.

Photohardenable electrostatic masters are needed that duplicate the imaging characteristics of a printing press. Such electrostatic masters are known wherein the conductivity of both the exposed and unexposed areas can be controlled by introducing into a photopolymerizable composition an electron donor or an electron acceptor molecule that modify the electrical properties of the composition and provides a dot gain similar to that achieved by a printing press.

Although the use of photopolymerizable compositions in electrophotography has been demonstrated and many formulations can be imaged, it did not appear possible, to produce a photopolymerizable electrostatic master that was capable of producing both positive and negative images. Such results have been achieved with photohardenable elements which have a conductive support bearing a photohardenable layer comprising a polymeric binder, a compound having at least one ethylenically unsaturated group, an initiator, a photoinhibitor and at least one sensitizing compound. Positive and negative images are achieved depending on the exposure sequence and exposure wavelength. Such elements are extremely useful because a single element will satisfy the proofing needs of all printers regardless of whether they work with negative or positive color separations. A disadvantage of these elements is that they require two exposures to provide a positive-working electrostatic master.

In electrophotography, a photoconductive layer is charged and upon imagewise exposure to light a localized decay of the charge results so that applied toners or developers are attracted to the unexposed areas. Electrophotographic apparatus are generally designed so that by subsequent exposure to light the conductive layer is locally discharged and toner is then applied. After transfer of the toner, the photoconductive layer is cleaned. For multiple copies the steps of charging, exposing to light, toning and transferring are repeated. Substantially every print produced varies at least slightly from another since the image quality is affected by variations in charging and light levels that occur.

It has been found that the above disadvantage can be overcome by means of a photosensitive electrostatic master having as a photosensitive layer a photosensitive composition of this invention wherein a single exposure will provide a positive-working electrostatic master. Furthermore, this element provides a print-out image which provides a visual determination regarding exposure of the element and avoids double exposure of the element which could otherwise occur. The photosensitive electrostatic master after a single exposure can be charged, toned, charged, toned, etc. many times resulting in duplicate permanent images.

SUMMARY OF THE INVENTION

In accordance with this invention there is provided a high resolution, photosensitive electrostatic master which upon imagewise exposure forms conductive exposed image areas, the master comprising an electrically conductive substrate bearing a layer of a photosensitive composition consisting essentially of (A) at least one organic polymeric binder,
(B) a hexaarylbiimidazole photooxidant,
(C) a leuco dye that is oxidizable to an ionic species by the photooxidant,
(D) a nonionic halogenated compound, and
(E) a compatible plasticizer.

In accordance with another embodiment of this invention there is provided a xeroprinting process for making positive images by a single imagewise exposure comprising the steps:

(A) exposing imagewise to actinic radiation a photosensitive electrostatic master comprising an electrically conductive substrate bearing a layer of a photosensitive composition consisting essentially of (A) at least one organic polymeric binder,
(B) a hexaarylbiimidazole photooxidant,
(C) a leuco dye that is oxidizable to an ionic species by the photooxidant,
(D) a nonionic halogenated compound, and
(E) a compatible plasticizer, (B) charging the master electrostatically to form a latent image of electrostatic charge in the unexposed areas, (C) developing the latent image by applying an oppositely charged electrostatic toner or developer, and (D) transferring the toned or developed image to a receptor surface.

DETAILED DESCRIPTION OF THE INVENTION

Throughout the specification the below listed terms have the following meanings:

In the claims appended hereto "consisting essentially of" means the composition of the photosensitive layer of the electrostatic master does not exclude unspecified components which do not prevent the advantages of the photosensitive electrostatic master from being realized. For example, in addition to the primary components, there can be present co-initiators, visible sensitizers, thermal stabilizers or thermal inhibitors, ultraviolet light absorbers, coating aids, electron acceptors, electron donors, electrical property modifiers, etc.

The invention is based on the discovery that photosensitive layers on conductive supports which consist essentially of components (A) to (E) above are capable of producing positive images with a single exposure, and furthermore a visual print-out image.

The photosensitive layer of the electrostatic master consists essentially of at least one organic polymeric binder, a hexaarylbiimidazole photooxidant, a leuco dye that is oxidizable to an ionic species by the photooxidant, a nonionic halogenated compound, and a compatible plasticizer, as more fully described below. Optionally at least one sensitizer compound is also present. Other ingredients can optionally be present, also as set out below.

Suitable polymeric binders (A) and hexaarylbiimidazole photooxidant compounds (B) are disclosed in Chambers U.S. Pat. No. 3,479,185, Chang U.S. Pat. No. 3,549,367, Baum et al. U.S. Pat. No. 3,652,275, Cescon U.S. Pat. No. 3,784,557, Dueber U.S. Pat. No. 4,162,162, Dessauer U.S. Pat. No. 4,252,887, Chambers et al. U.S. Pat. No. 4,264,708, Tanaka et al. U.S. Pat. No. 4,459,349, and Sheets U.S. Pat. No. 4,622,286, the disclosures of each of which are incorporated herein by reference.

Examples of polymeric binders (A) include: polymerized methyl methacrylate resins, including copolymers thereof, etc.; polyvinyl acetals such as polyvinyl butyral and polyvinyl formal, etc.; vinylidene chloride copolymers, e.g., vinylidene chloride/acrylonitrile, vinylidene chloride/methacrylate, vinylidene chloride/vinylacetate copolymers, etc.; synthetic rubbers, e.g., butadiene/acrylonitrile copolymers and chloro-2-butadiene-1,3-polymers, etc.; cellulose esters, e.g., cellulose acetate, cellulose acetate succinate and cellulose acetate butyrate, etc.; polyvinyl esters, e.g., polyvinyl acetate/acrylate, polyvinyl acetate/methacrylate and polyvinyl acetate etc.; polyvinyl chloride and copolymers, e.g., polyvinyl chloride/acetate, etc.; polyurethanes, polystyrene, and styrene/methyl methacrylate copolymers. Preferred binders are poly(styrene/methyl methacrylate) and poly(methyl methacrylate).

Examples of hexaarylbiimidazole photooxidants (B) are 2,2',4,4',5,5'-hexaarylbiimidazoles, sometimes referred to as 2,4,5-triarylimidazolyl dimers also known as HABI's, which dissociate on exposure to actinic radiation to form the corresponding triarylimidazolyl free radicals. Any 2-o-substituted HABI disclosed in the prior patents are useful in the photosensitive compositions of this invention. The HABI's can be represented by the general formula:

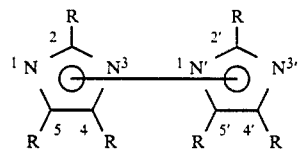

where The R's represent aryl radicals, e.g., phenyl, naphthyl, preferably phenyl radicals, which can be substituted as described in Cescon U.S. Pat. No. 3,784,557, col. 2, line 20 to col. 3, line 67 and col. 23, line 53 to 74, the disclosures of which are incorporated herein by reference. The 2-o-substituted HABI's are those in which the aryl radicals at positions 2 and 2' are ortho-substituted. The other positions on the aryl radicals can be unsubstituted or carry any substituent which does not interfere with the dissociation of the HABI upon exposure or adversely affect the electrical or other characteristics of the photosensitive system. Preferred HABI's are 2-o-chloro-substituted hexaphenylbiimidazoles in which the other positions on the phenyl radicals are unsubstituted or substituted with chloro, methyl or methoxy. The most preferred HABI is 2,2'-bis(o-chlorophenyl)-4,4',5,5'-tetraphenylbiimidazole.

Leuco dyes (C) useful in this invention are disclosed in Cescon, U.S. Pat. No. 3,598,592, the disclosure of which is incorporated herein by reference. The leuco dyes described in said patent, column 9, lines 4 to 18, preferably are stable in the leuco dye form when present in the photosensitive composition. Leuco dyes that are less stable than those described above can be used if a thermal stabilizer or inhibitor as described below is present in the composition.

The leuco form of the dye, which comprises one component of the photosensitive composition of the present invention, is the reduced form of the dye having one hydrogen atom, the removal of which together with an additional electron in certain cases produces the dye, i.e., a differently colored compound. Such dyes have been described, for example, in U.S. Pat. No. 3,445,234, column 2, lines 49 to 63 and column 3, line 39 to column 7, line 55, incorporated herein by reference. The following classes are included:

(a) aminotriarylmethanes
(b) aminoxanthenes
(c) aminothioxanthenes
(d) amino-9,10-dihydroacridines
(e) aminophenoxazines
(f) aminophenothiazines
(g) aminodihydrophenazines
(h) aminodiphenylmethanes.

Aminotriarylmethanes are preferred. A general preferred aminotriarylmethane class is that of the acid salts of aminotriarylmethanes wherein at least two of the aryl groups are phenyl groups having (a) an $R_1R_2N$-substituent in the position para to the bond to the methane carbon atom wherein $R_1$ and $R_2$ are each groups selected from hydrogen, $C_1$ to $C_{10}$ alkyl, 2-hydroxyethyl, 2-cyano-ethyl, or benzyl and (b) a group ortho to the methane carbon atom which is selected from lower alkyl (C is 1 to 4), lower alkoxy (C is 1 to 4), fluorine, chlorine or bromine; and the third aryl group may be the same as or different from the first two, and when different is selected from (a) Phenyl which can be substituted with lower alkyl, lower alkoxy, chloro, diphenylamino, cyano, nitro, hydroxy, fluoro or bromo;
(b) Naphthyl which can be substituted with amino, di-lower alkylamino, alkylamino;
(c) Pyridyl which can be substituted with alkyl;
(d) Quinolyl;
(e) Indolinylidene which can be substituted with alkyl.

Preferably, $R_1$ and $R_2$ are hydrogen or alkyl of 1 to 4 carbon atoms. Particularly preferred leuco dyes from class (a) above are compounds disclosed in Cescon U.S. Pat. No. 3,598,592, column 9, lines 4 to 18, Class I compounds, because they are stabilized. A preferred stabilized leuco dye compound from class (b) above is 9-diethylamino-12-(2-methoxycarbonylphenyl)-benz(a)-xanthene.

Useful halogenated compounds (D) include: the halogenated hydrocarbons, which can be aromatic, aliphatic, alicyclic, and combinations thereof. Preferably the halogenated compounds are nonionic. In addition to halogen, these compounds can be substituted by oxygen, amine, amide, hydroxyl, nitrile or phosphate. The hydrocarbyl rings or chains can be interrupted by ether (—O—), ester

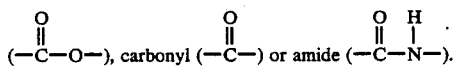

(—C(=O)—O—), carbonyl (—C(=O)—) or amide (—C(=O)—N(H)—).

Halogenated aliphatic compounds include: the halogenated alkanes and alkenes of 1 to about 8 carbon atoms, illustrated by such alkanes as carbon tetrachloride; carbon tetrabromide; bromoform; iodoform; iodoethane; 1,2-diiodoethane; 2-bromo-1-iodoethane; 1,2-dibromoethane; 1-bromo-1-chloroethane; 1,1,2,2-tetrabromoethane; hexachloroethane; 1,1,1-trichloroethane; 1,1-bis-(p-chlorophenyl)-2,2,2-trichloroethane; substituted 1,2-dibromoethane compounds as disclosed in Holman U.S. Pat. No. 4,634,657 col. 1, line 56 to col. 2, line 7 and col. 2, line 51 to col. 3, line 2, the disclosures of which are incorporated herein by reference, include: 1,2-dibromo-1,1,2-trichloroethane; 1,2-dibromotetrachloroethane, 1,2-dibromo-1,1-dichloroethane, 1,2-dibromo-1,1-dichloro-2,2-difluoroethane, etc.; 1-bromo-3-chloropropane; 1,2-dibromo-3-chloropropane; 1,2,3-tribromopropane; 1-bromobutane; 2-bromobutane; 1,4-dibromobutane; 1-bromo-4-chlorobutane; 1,4-diiodobutane; 1,2,3,4-tetrabromobutane; pentamethylene bromide;hexamethylene bromide, etc.; the halogenated alkanols of 2 to about 8 carbon atoms such as 2-bromoethanol; 2,2,2-trichloroethanol; tribromoethanol; 2,3-dibromopropanol; 1,3-dichloro-2-propanol; 1,3-diiodo-2-propanol; 1,1,1-trichloro-2-propanol; di(iodohexamethylene) aminoisopropanol; 1,1,1-trichloro-2-methyl-2-propanol; tribromo-t-butyl alcohol; 2,2,3-trichlorobutane-1,4-diol; halogenated cycloaliphatic compounds such as tetrachlorocyclopropene; dibromocyclopentane; hexachlorocyclopentadiene; dibromocyclohexane; chlorendic anhydride; the halogenated aliphatic carbonyl containing compounds of 2 to about 8 carbon atoms, which are illustrated by 1,1-dichloroacetone; 1,3-dichloroacetone; hexachloroacetone; hexabromoacetone; pentachloroacetone; 1,1,3,3-tetrachloroacetone; 1,1,1-trichloroacetone; 3,4-dibromobutanone-2; 1,4-dichlorobutanone-2; 1,2,5-trichloropentanone-2; dibromocyclohexanone; the halogenated ethers of 3 to about 8 carbon atoms are illustrated by 2-bromoethyl methyl ether; 2-bromoethyl ethyl ether; di(2-bromoethyl)ether; di-(2-chloroethyl)ether; 1,2-dichloroethyl ethyl ether, etc.

The amide and ester halogenated compounds are conveniently discussed in connection with the halogenated mono- or dicarboxylic acids of 2 to 8 carbon atoms, as the esters and amides thereof. These compounds will have the general formula:

where
X is Cl, Br or I
a is an integer from 1 to 4
A is alkyl or alkenyl of 1 to 7 carbon atoms
G is

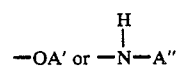

where A' is alkyl or haloalkyl of 1 to 15 carbon atoms where halo is Cl, Br or I; A" is hydrogen, alkyl or haloalkyl of 1 to 4 carbon atoms where halo is Cl, Br or I; b is 1 or 2.

In providing that a is an integer from 1 to 4, it is noted that the obviously chemically impossible structures such as tetrachloroacetamide and $\beta,\beta,\beta$-trichlorobutyramide are excluded. Thus, the provision that a is an integer from 1 to 4 is intended to be a shorthand way of indicating that a is an integer from 1 to 3 when A has one carbon atom and that a is an integer from 1 to 4 when A has 2 to 7 carbon atoms, provided that no carbon atom bound to two other carbon atoms contains more than two halogen atoms and no carbon atom bound to one carbon atom contains more than 3 halogen atoms. A can be methyl, ethyl, butyl, amyl, hexyl, heptyl, including the isomers thereof; vinyl, allyl, isopropenyl, butenyl, isobutenyl, or pentenyl.

The ester can be the ester of a halogenated carboxylic acid as exemplified by chloroacetic; bromoacetic; iodoacetic; dichloroacetic; trichloroacetic; tribromoacetic; 2-chloropropionic; 3-bromopropionic; 2-bromoisopropionic; 2,3-dibromopropionic; 3-iodopropionic; $\alpha$-bromobutyric; $\alpha$-bromoisobutyic; 3,4-dibromobutyic; etc.; bromosuccinic; bromomaleic and dibromomaleic, etc., the halogenated ester of a carboxylic acid or the halogenated ester of a halogenated carboxylic acid. The esters are exemplified by bromoethyl acetate; ethyl trichloracetate; trichloroethyl trichloroacetate; isoctyl trichloroacetate; isotridecyl trichloroacetate; homopolymers and copolymers of 2,3-dibromopropyl acrylate; trichloroethyl dibromopropionate; iodoethyl dibromobutyrate; ethyl, $\alpha,\beta$-dichloroacrylate; ethyl, 3,4-dibromovinylacetate, etc.

The amides are exemplified by chloroacetamide; bromoacetamide; iodoacetamide; dichloroacetamide; trichloroacetamide; tribromoacetamide; trichloroethyl trichloroacetamide; 3-bromopropionamide; 2-bromoisopropionamide; 2,3-dibromopropionamide; 2,2,2-trichloropropionamide; 2-bromobutyramide; 2-bromoisobutyramide and N-chlorosuccinimide, N-bromosuccinimide, 2,3-dibromosuccinimide, 2,3,4,5-tetraiodopyrrole, N-[1,1-bis-(p-chlorophenyl)-2,2,2-trichloro-ethyl] acetamide, etc. Preferred amides are those melting in the range 90° to 150° C. such as the following compounds:

| COMPOUND | MELTING POINT (°C.) |
| --- | --- |
| $BrCH_2CONH_2$ | 91 |
| $ClCH_2CONH_2$ | 121 |
| $Cl_2CHCONH_2$ | 99.4 |
| $ICH_2CONH_2$ | 95 |
| $Br_3CCONH_2$ | 121.5 |

| COMPOUND | MELTING POINT (°C.) |
|---|---|
| Cl$_3$CCONH$_2$ | 142 |
| BrCH$_2$CH$_2$CONH$_2$ | 111 |
| (CH$_3$)$_2$CBrCONH$_2$ | 148 |
| CH$_3$CH$_2$CHBrCONH$_2$ | 112.5 |
| (CH$_3$)$_2$CHCHBrCONH$_2$ | 133 |

Other halogenated aliphatic hydrocarbon compounds include chlorinated rubbers such as the Parlons ® (Hercules, Inc., Wilmington, DE); poly (vinyl chloride); copolymers of vinyl chloride and vinyl isobutyl ether such as Vinoflex ® MP-400 (BASF Colors & Chemicals, Inc., Parsippany, NJ); chlorinated aliphatic waxes such as Chlorowax ® 70 (Occidental Electrochemicals Corp., Los Angeles, Calif.); perchlorocyclodecane; chlorinated paraffins such as Clorafin ® 40 (Hercules, Inc., Wilmington, DE) and Unichlor ® 70B (Dover Chemical Corp., Dover, OH); and 2,3-bis-(bromoethyl)-1,4-dibromo-2-butene.

The aromatic hydrocarbon compounds include the polyhalo benzenes such as the di-, tri-, tetra-, penta- and hexachlorobenzenes and bromobenzenes; the di-, tri-, and tetra- chloroxylenes and bromoxylenes; di- and trichloroaniline and bromoaniline; the polyhalogenated polyphenyl compounds such as the Araclor ® plasticizers (Monsanto Co., St. Louis, Mo.) which in general are polychlorinated diphenyls, polychlorinated triphenyls and mixtures thereof; hexabromobiphenyl, tetrabromobisphenol A, etc.

While it is apparent that both aliphatic and aromatic halides can be successfully employed, it is preferred to use the aliphatic halides; of the aliphatic halides, it is generally preferred to use those halides having more than one halogen atom bound to the same carbon atom, and it is particularly preferred to use those halogenated aliphatic compounds where there are three halogen atoms bound to a single carbon atom. The halogen containing material can be present as single compound or as a mixture of halogen containing compounds.

Where the compositions are to be prepared and stored for periods of time, stability becomes a factor. For that reason, the volatile materials such as carbon tetrabromide, iodoform, ethyl iodide and 2,2,2-trichloroethanol, which normally work quite well are not preferred in electrostatic masters that will be stored for appreciable periods. These compounds are generally not used because of their odor and/or high volatility. Thus, the halogenated compounds that are nonvolatile liquids or solids are preferred.

A wide range of nonpolymerizable compatible plasticizers (E) are effective in achieving reasonable exposure time and good printout images. When a macromolecular binder is present in the photosensitive layer, the plasticizer selected is compatible with the binder as well as the other components of the composition. With acrylic binders, for example, useful plasticizers include: dibutyl phthalate, dioctyl phthalate, and other esters of aromatic acids; esters of aliphatic polyacids such as diisooctyl adipate, and nitrate esters; aromatic or aliphatic acid esters of glycols, polyoxyalkylene glycols, aliphatic polyols; alkyl and aryl phosphates; low molecular weight polyesters of poly-alpha-methylstyrenes; and chlorinated paraffins; etc. In general, water insoluble plasticizers are preferred for greater high humidity storage stability and environmental operating latitude, but are not required. Specific useful plasticizers include, triethylene glycol, triethylene glycol diacetate, triethylene glycol dipropionate, triethylene glycol dicaprylate, triethylene glycol dimethyl ether, triethylene glycol bis(2-ethyl-hexanoate), tetraethylene glycol diheptanoate, poly(ethylene glycol), poly(ethylene glycol) methyl ether, diethylene glycol dibenzoate, isopropylnaphthalene, diisopropylnaphthalene, poly(propylene glycol), glyceryl tributyrate, diethyl adipate, diethyl sebacate, dibutyl suberate, tributyl phosphate, tris (2-ethylhexyl) phosphate, t-butylphenyl diphenyl phosphate, triacetin, triisooctyl trimellitate, Brij ® 30 [C$_{12}$H$_{25}$(OCH$_2$CH$_2$)$_4$OH], and Brij ® 35 [C$_{12}$H$_{25}$(OCH$_2$CH$_2$)$_{20}$OH], Brij ® is a registered trademark of ICI Americas, Wilmington, DE; tris(2-butoxyethyl) phosphate and phthalates such as dicyclohexyl phthalate, dioctyl phthalate, diphenyl phthalate, diundecyl phthalate, butyl benzyl phthalate, 2-ethylhexyl benzyl phthalate, 1,2-benzene dicarboxylic acid, 2,2-dimethyl-1-(1-methylethyl)-3-(2-methyl-1-oxopropoxy)propyl phenyl methyl ester. The latter compound is Santicizer ® 278, manufactured by Monsanto Co., St. Louis, Mo., etc. Many of the plasticizers can be expressed by the following general formulae:

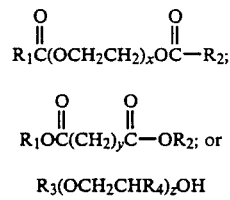

wherein each of R$_1$ and R$_2$ is alkyl group of 1 to 10 carbon atoms; R$_3$ is H or an alkyl group having 8 to 16 carbon atoms, R$_4$ is H or CH$_3$; x is 1 to 4; y is 2 to 10 and z is 1 to 20. Particularly preferred plasticizers for use in simple cellulose acetate butyrate systems are triethylene glycol dicaprylate, tetraethylene glycol diheptanoate, diethyl adipate, triacetin, Brij ® 30 and tris-(2-ethylhexyl)phosphate. Additional plasticizers that are useful in the photosensitive compositions will be apparent to those skilled in the art, and may be employed in accordance with the invention. Preferred plasticizers are those which are moisture insensitive and those which are not extracted by nonpolar liquids such as Isopar ®-L.

The combination of binder and plasticizer is important for achieving the necessary minimum contrast potential, i.e., the difference in voltage between the exposed and unexposed areas at the time of development, to achieve the desired developed image density. The combination of binders and plasticizers to give matrixes with different glass transition temperatures (Tg's) is selected so that some degree of charge mobility within the film matrix is achievable.

Additional useful components that can be present in the photosensitive layer include: co-initiators, visible sensitizers, thermal stabilizers or thermal inhibitors, brighteners, UV light absorbers, coating aids, electron acceptors, electron donors, electrical property modifiers, etc. Useful co-initiators include: other HABI's, benzophenones, alkylarylketones and mixtures thereof.

Visible sensitizers such as the arylylidene aryl ketone that may also be present in the photosensitive layer are disclosed in Dueber, U.S. Pat. No. 4,162,162, the disclosure of which is incorporated herein by reference. The sensitizers absorb radiation in the broad spectral range of 300 to 700 nm. The maximum absorption (Amax.) is in the range of 350 to 550 nm, preferably 400 to 500 nm.

Useful thermal stabilizers or inhibitors include: hydroquinone, 1,4,4-trimethyl-diazobicyclo-(3.2.2)-non-2-ene-2,3-dioxide, 1-phenyl-3-pyrazolidone, p-methoxyphenol, alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene, dinitrobenzene, p-toluquinone and chloranil. The dinitroso dimers described in Pazos U.S. Pat. No. 4,168,982, the disclosure of which is incorporated herein by reference, are also useful. Preferably a thermal stabilizer or inhibitor is present in the photosensitive composition to increase stability in the storage of the photosensitive composition.

Useful UV absorbers and coating aids are known to those skilled in the art.

Useful electron donors and electron acceptors include: aromatic amines, e.g., triphenyl amine, methyl diphenyl amine, N-dimethyl aniline, aromatic phosphines, e.g., triphenyl phosphine, aromatic arsines, e.g., triphenyl antimony, carbazole compounds, e.g., 9-ethylcarbazole, poly(9-vinylcarbazole), polycyclic aromatic compounds, e.g., naphthalene, benzophenone, trinitrofluorenone, p-biphenyl. Triphenylamine is a preferred electron donor, biphenyl is a preferred electron acceptor.

Other additives which may modify electrical properties and ultimate print quality include: N-phenylglycine, 1,1-dimethyl-3,5-diketocyclohexane, and organic thiols such as 2-mercaptobenzothiazole, 2-mercaptobenzoxazole, 2-mercaptobenzimidazole, pentaerythritol tetrakis-(mercaptoacetate), 4-acetamidothiophenol, dodecanethiol, and beta-mercaptoethanol. Other compounds which can be used include: 1-phenyl-4H-tetrazole-5-thiol, 6-mercaptopurine monohydrate, bis-(5-mercapto-1,3,4-thiodiazol-2-yl), 2-mercapto-5-nitrobenzimidazole, and 2-mercapto-4-sulfo-6-chlorobenzoxazole, etc.

In general, the essential components of the photosensitive composition should be used in the following approximate proportions: (A) binder, 40 to 85 percent, preferably 50 to 70 percent; (B) hexaarylbibimidazole photooxidant, 1 to 20 percent, preferably 2 to 6 percent; (C) leuco dye, 0.5 to 40 percent, preferably 0.5 to 3 percent; (D) halogenated compound, 0.25 to 10 percent, preferably 0.25 to 5 percent; and (E) plasticizer 2 to 50 percent, preferably 10 to 40 percent. These are weight percentages based on total weight of the photosensitive composition. The preferred proportions may depend upon the particular compounds selected for each component. For example, the amount of HABI may depend upon film speed requirement. Compositions with HABI content above 10 percent by weight, for example, provide films of high sensitivity (high speed) and can be used with laser imaging in recording digitized information, as in digital color proofing. Such films are the subject of Dessauer and Ma U.S. application Ser. No. 07/169,127, filed Mar. 10, 1988. For analog applications, e.g., exposure through a separation or phototool, film speed requirement depends upon the mode of exposure.

The photosensitive electrostatic master is prepared by mixing the photosensitive ingredients in a solvent such as methylene chloride, or any other solvent that will dissolve all the ingredients of the photosensitive composition. Higher boiling cosolvents that aid in coating, drying are also useful, e.g., methanol, isopropanol, etc. The photosensitive solution is then coated on a conductive substrate, and the solvent is evaporated. Dry coating weight should be about 40 to 200 mg/dm$^2$.

The conductive support may be a metal plate, such as aluminum, copper, zinc, silver or the like, a conductive polymeric film, e.g., polyethylene terephthalate, etc., or a support such as paper, glass, synthetic resin, etc. which have been coated on one or both sides with a metal, conductive metal oxide, or conductive metal halide by vapor deposition or chemical deposition, a support which has been coated with a conductive polymer, or a support which has been coated with a polymeric binder containing a metal, conductive metal oxide, conductive metal halide, conductive polymer, carbon, or other conductive fillers, etc.

Positive images are prepared advantageously by a single imagewise exposure followed by charging and toning. The photosensitive layer is exposed to radiation of wavelength in the 200 to 500 nm range preferably about 310 to about 400 nm, and most preferably about 360 nm. Any convenient source of ultraviolet/visible light may be used to activate the light-sensitive composition and induce the formation of an image. In general, light sources that supply radiation in the region between about 2000 Å and about 5000 Å are useful in producing images. Among the light sources which can be employed are sun lamps, electronic flash guns, germicidal lamps, carbon arcs, mercury-vapor arcs, fluorescent lamps with ultraviolet emitting phosphors, argon and xenon glow lamps, electronic flash units, photographic flood lamps, ultraviolet lamps providing specifically light of short wavelength (2537 Å) and lamps providing light of long wavelength (4500 Å). The light exposure time will vary from a fraction of a second to several minutes depending upon the intensity of the light, its distance from the photosensitive composition, the opacity of the phototool, the nature and amount of the photosensitive composition, and the intensity of color in the image desired. There may also be used coherent light beams, for example, pulsed nitrogen lasers, argon ion lasers and ionized Neon II lasers, whose emissions fall within or overlap the ultraviolet absorption bands of the HABI. Visible light emitting lasers such as argon ion, krypton ion, helium-neon, and frequency doubled YAG lasers may be used for visibly sensitized photosensitive layers.

Ultraviolet emitting cathode ray tubes widely useful in printout systems for writing on photosensitive materials are also useful for imaging the subject compositions. These in general involve a UV-emitting phosphor internal coating as the means for converting electrical energy to light energy and a fiber optic face plate as the means for directing the radiation to the photosensitive target. For purposes of this invention, the phosphors should emit strongly below 420 nm (4200 Å) so as to substantially overlap the near UV-absorption characteristic of the photosensitive compositions of the invention. Representative phosphors include the P4B (emitting at 300–550 nm, peaking at 410 nm), P16 (330–460 nm, peaking at 380 nm) and P22B (390–510 nm, peaking at 450 nm) types. Electronic Industries Association, New York, N.Y. assigns P-numbers and provides characterizing information on the phosphors; phosphors with the same P-number have substantially identical characteristics.

Images may be formed in the photosensitive layer by a beam of light or by exposure to light of a selected area behind a positive separation, a stencil, or other relatively opaque pattern. The positive separation may be one in which the opacity results from aggregations of areas of different refractive index. Image formation may also be accomplished in a conventional diazo printing apparatus, or in a thermography device, provided the instrument emits some of its light in the ultraviolet range. A piece of onionskin or light-to-medium-weight bond paper which bears typewriting, for example, will serve as a master pattern from which copies can be made.

Where artificial radiation sources are used, the distance between the photosensitive layer and the radiation source may be varied according to the radiation sensitivity and the nature of the photosensitive composition. Customarily, mercury vapor arcs are used at a distance of 1.5 to 60 (3.8 to 152.4 cm) inches from the photosensitive layer. Radiation fluxes of 10–10,000 uw/cm$^2$ are generally suitable for use.

The length of time for which the photosensitive compositions are exposed to radiation may vary upward from fractions of a second. The exposure times will vary, in part, according to the nature and concentration of the stabilized leuco dye, halogenated compound, compatible plasticizer, photooxidant, and the type of radiation. Exposure can occur over a wide range of temperatures, as for example, from about 0° C. up to about +40° C. with selected compositions. Preferred exposure temperatures range from about 10° to about +35° C. There is an obvious economic advantage to operating the process at room temperature.

Imagewise exposure, for example in preparing electrostatic masters, is conveniently carried out by exposing a layer of the photosensitive composition to radiation through a process transparency; that is, an image-bearing transparency consisting solely of areas substantially opaque and substantially transparent to the radiation being used where the opaque areas are substantially of the same optical density; for example, a so-called line or halftone negative or positive. Process transparencies may be constructed of any suitable coated material, including cellulose acetate film and polyethylene terephthalate film. Charging and toning of the exposed master provides a positive working master suitable for use in color proofing applications, etc.

The preferred charging means is corona discharge. Other charging methods, e.g., discharge of a capacitor, can also be used.

Any electrostatic liquid toner or dry powder toner and any method of toner application can be used. Preferred liquid toners, consist essentially of a suspension of pigmented resin toner particles in a nonpolar liquid, the toner particles being charged with ionic or zwitterionic compounds. The nonpolar liquids normally used are the Isopar ® branched chain aliphatic hydrocarbons (registered trademark of Exxon Corporation) which have a Kauri-butanol value of less than 30. These are narrow high purity cuts of isoparaffinic hydrocarbon fractions with the following boiling ranges Isopar ®-G, 157°–176° C., Isopar ®-H 176°–191° C., Isopar ®-K 177°–197° C., Isopar ®-L 188°–206° C., Isopar ®-M 207°–254° C., Isopar ®-V 254°–329° C. Preferred resins having an average particle size of less than 10 μm, preferably less than 5 μm, are copolymers of ethylene (80 to 99.9%)/acrylic or methacrylic acid (20 to 0%)/alkyl ester of acrylic or methacrylic acid where alkyl is 1 to 5 carbon atoms (0 to 20 %), e.g., copolymers of ethylene (89%) and methacrylic acid (11 %) having a melt index at 190° C. of 100. Preferred nonpolar liquid soluble ionic or zwitterionic charge director compounds are lecithin and Basic Barium Petronate ® oil-soluble petroleum sulfonate, Witco Chemical Corp., New York, N.Y. Optionally present in the nonpolar liquid is at least one adjuvant compound as described in Mitchell U.S. Pat. Nos. 4,631,244, 4,663,264, and 4,734,352, Taggi U.S. Pat. No. 4,670,370, Larson U.S. Pat. No. 4,702,985, Larson and Trout U.S. Pat. No. 4,681,831, El-Sayed and Taggi U.S. Pat. No. 4,702,984, and Trout U.S. Pat. No. 4,707,429. The disclosures of these United States patents are incorporated herein by reference.

Useful developing techniques include the cascade, magnetic-brush and powder-craft methods using dry toners. Standard known liquid developer techniques can be used with the liquid electrostatic developers.

After toning or developing, the toned or developed image is transferred to a receptor surface, such as paper, etc. for the preparation of a proof. It is possible to transfer from the latter to another receptor to get a right reading image. Other receptors without being limited are polymeric film, or cloth. For making integrated circuit boards, the transfer surface can be an insulating board covered with a conductor, e.g., a fiber glass board covered with a copper layer, on which a resist is printed by this process. Transfer is accomplished by electrostatic or other means, e.g., by contact with an adhesive receptor surface. Electrostatic transfer can be accomplished in any known manner, e.g., by placing the transfer surface in contact with the toned image, applying a squeegee to assure maximum contact, and applying corona discharge to the backside of the transfer element.

INDUSTRIAL APPLICABILITY

The photosensitive electrostatic master is particularly useful in the graphic arts field, particularly in the area of color proofing wherein the proofs prepared duplicate the images achieved by printing. Because of the molecular structure of the dye images, very high resolution is feasible . A photosensitive electrostatic master with a print out image (POI) has additional advantages which include:

(1) the user can immediately determine that the master has been exposed;

(2) multiple burns or images can be made and positioned easily;

(3) Visual corrections can be made more easily; this is very important in removal of cut-lines from positive photosensitive masters;

(4) unexposed areas can be annotated with a light-pen and the annotation will then become. part of the information on the master; and.

(5) the ability to generate POI's in different colors makes it possible to color-code masters, e.g., the master from a cyan separation may have a cyan-POI, the master from the magenta separation giving a magenta-POI, etc.; this can avoid errors due to mispositioning the master in a sequential printing system.

The photosensitive electrostatic master can also be used to transfer an etch resistant ink for the manufacture of printed circuit boards.

EXAMPLES

The following examples illustrate but do not limit the invention wherein the percentages and parts are by weight. Weight average molecular weight is determined by gel permeation chromatography. Inherent viscosity is determined by using a solution containing 0.25 g polymer in 50 ml methylene chloride measured at 20° C. using a No. 50 Cannon-Fenske viscometer.

EXAMPLE 1

A photosensitive element was prepared having a 0.004 inch (0.0102 cm) aluminized polyethylene terephthalate support with an optical density of greater than 2, a photosensitive layer having a coating weight of 110 mg/dm$^2$, and a 0.00075 inch (0.002 cm) polypropylene coversheet. The photosensitive layer had the following composition:

| INGREDIENT | WEIGHT (g) |
|---|---|
| Methylene chloride | 188 |
| 2,2'-bis(o-chlorophenyl)-4,4',5,5'-tetraphenylbiimidazole | 1 |
| 1,2-dibromotetrachloroethane | 0.5 |
| Dioctyl phthalate | 15 |
| Tris-(4-diethylamino-o-tolyl)methane | 0.5 |
| Poly(methyl methacrylate), inherent viscosity of 1.3 | 33 |

The photosensitive element was prepared by mixing the above ingredients, coating onto aluminized polyethylene terephthalate support and evaporating the solvent by overnight air drying. A 6 inch (15.24 cm) square sample of the element was prepared. One half was covered so it would not be exposed to ultraviolet (uv) light and the other half was exposed to 50 mj/cm$^2$ uv radiation. A Berkey-Ascor exposure unit and vacuum were used in combination with a Kokomo Glass Filter (400), Kokomo Opalescent Glass Co., Kokomo, Ind. to filter out visible light. The light source was a 5 kw diazo bulb. The lamp output was measured with an IL-1700 Research Radiometer with an XRD140A detector from International Light Inc., Newburyport, Mass. After exposure, the coversheet was peeled off leaving an element that retained charge in the unexposed areas. The element was charged with a scorotron having a 44 percent open grid, spaced 0.5 mm from the element and operated at 100-300 volts and a wire operated at 550 micro Amp. The retained voltage was measured with a Model 344 Isoprobe Electrostatic Voltameter, Monroe Electronics, Lyndonville, N.Y., as a function of time after charging.

The grid voltage was adjusted to obtain a peak voltage of 210-220 volts in the unexposed area of the element and the time for the voltage to decay to ½ its initial value was measured for the unexposed and exposed areas. Temperature was 70° F. (21.1° C.) and relative humidity (RH) was 56%. The results are shown in Table 1 below. As shown in Table 1, the element was charged to 220 volts and the charge took 54 seconds to decay to one-half its initial value in the unexposed area. However, in the exposed area, the initial charge was only 110 volts, and this charge decayed to one-half its initial value in only 0.9 second. This indicates the element is substantially non-conductive before exposure to uv radiation, and becomes conductive when exposed to uv radiation. In addition, exposure to uv radiation causes the normally clear uncolored element to develop a dark cyan color (when viewed in yellow light and a dark blue color when viewed in white light). The change in conductivity of the element can be used to form colored images Image quality was determined by placing the emulsion side of a UGRA plate control wedge (PCW), Graphic Arts Technical Foundation, Pittsburgh, Pa, that includes 0.5% highlight dots to 99.5% shadow dots in a 150 lines/inch (lpi) screen and the emulsion side of a Brunner target, available from System Brunner U.S.A., Inc., Rye, N.Y., which includes a block of 50% halftone dots on top of the photosensitive layer and exposing the element to uv radiation. The Berkey-Ascor exposure unit described above with the Kokomo filter was used. A vacuum was drawn for 60 seconds to obtain good contact between the PCW, the Brunner target and the photosensitive layer. After exposure, the coversheet was peeled off the exposed element, the element was then mounted on a drum surface, which rotates at 2.2 inches (5.59 cm) per second, with leading edge clamps that are used to ground the photosensitive master aluminized backplane to the drum, then charged electrostatically as described below. The resulting electrostatic image was developed with liquid electrostatic developer described below of opposite polarity, and the developed image was electrostatically transferred from the element to paper. The charging of the element was accomplished with a scorotron placed at about the 2 o'clock position on the drum and having a 44 percent open grid, spaced 0.5 mm from the element and operated at 100-300 V, and a wire operated at 550 microAmp. The element was developed 3.5 seconds after charging using a magenta liquid electrostatic developer (1.5% solids concentration) similar to that described in Example 10 of Trout U.S. Pat. No. 4,707,429, the disclosure of which is incorporated herein by reference wherein the lecithin charge director was replaced by Basic Barium Petronate ® oil-soluble petroleum sulfonate, and the developer had a conductivity of 10-20 pmho/cm. The developed image was transferred to 60# Textweb paper, Seneca Paper Co., Rochester, N.Y. using a combination of a conductive rubber tackdown roller, operated at −2 to −6 kV, and a transfer scorotron, operated at 20-50 microAmp. The paper was placed between the developed element and the conductive rubber tackdown roller so that the paper was in contact with the developed developed image. The paper was then passed under the scorotron causing the developed image on the element to be transferred to the paper. The image was then fixed to the paper by fusing at 110° C. for 1 minute. Results are shown in Table 2 below. Solid density was measured with a Macbeth Model RD-918-SB Densitometer from Kollmorgen Corp., Newburgh, N.Y. The image obtained had an excellent dot tonal range of 2-98% (150 lpi screen) and a mid tone (50%) dot gain of 15% at a solid density of 1.36.

EXAMPLE 2

A photosensitive element was prepared and evaluated as described in Example 1 with the following exception: the photosensitive layer had a coating weight of 100 mg/dm$^2$ and the following composition:

| INGREDIENT | WEIGHT (g) |
|---|---|
| Methylene chloride | 188 |
| Hexaarylbiimidazole described in Ex. 1 | 1 |
| 4,4'-bis(diethylamino)benzophenone | 0.25 |
| 1,2-dibromotetrachloroethane | 0.5 |
| Dioctyl phthalate | 15 |
| Tris-(4-diethylamino-o-tolyl)methane | 0.5 |
| Poly(methyl methacrylate) described in Ex. 1 | 33 |

The addition of 4,4'-bis(diethylamino)benzophenone increases the film speed by increasing the rate of charge decay at equal exposure. This element yields a transferred image with excellent 2-99.5% dot tonal range, and has excellent charge decay rates as shown in Tables 2 and 1 below, respectively.

EXAMPLE 3

A photosensitive element was prepared and evaluated as described in Example 1 with the following exception: the photosensitive layer had a coating weight of 150 mg/dm$^2$ and the following composition:

| INGREDIENT | WEIGHT (g) |
| --- | --- |
| Methylene chloride | 262 |
| Hexaarylbiimidazole described in Ex. 1 | 1 |
| 1-phenyl-3-pyrazolidone | 0.01 |
| 1,2-dibromotetrachloroethane | 0.25 |
| Triacetin | 8 |
| Tris-(4-diethylamino-o-tolyl)methane | 0.5 |
| Cellulose acetate butyrate Grade EAB-381-20 | 40.24 |

Results are found in Tables 1 and 2 below.

EXAMPLE 4

A photosensitive element was prepared and evaluated as described in Example 1 with the following exception: the photosensitive layer had a coating weight of 126 mg/dm$^2$ and the following composition:

| INGREDIENT | WEIGHT (g) |
| --- | --- |
| Methylene chloride | 188 |
| Hexaarylbiimidazole described in Ex. 1 | 1 |
| 1-phenyl-3-pyrazolidone | 0.01 |
| 1,2-dibromotetrachloroethane | 0.25 |
| t-butylphenyl diphenyl phosphate | 16 |
| Tris-(4-diethylamino-o-tolyl)methane | 0.5 |
| Styron ® 685D polystyrene Dow Chemical Corp., Midland, MI; weight average molecular weight is 300,000 | 32.24 |

Results are found in Tables 1 and 2 below.

EXAMPLE 5

A photosensitive element was prepared and evaluated as described in Example 1 with the following exception: the photosensitive layer had a coating weight of 106 mg/dm$^2$ and the following composition:

| INGREDIENT | WEIGHT (g) |
| --- | --- |
| Methylene chloride | 188 |
| Hexaarylbiimidazole described in Ex. 1 | 1 |
| Trichloroacetamide | 0.25 |
| Dioctyl phthalate | 15 |
| Tris-(4-diethylamino-o-tolyl)methane | 0.5 |
| Poly(methyl methacrylate) described in Ex. 1 | 33.25 |

Results are found in Tables 1 and 2 below.

CONTROL 1

A photosensitive element was prepared and evaluated as described in Example 1 with the following exception: the photosensitive layer had a coating weight of 106 mg/dm$^2$ and the following composition:

| INGREDIENT | WEIGHT (%) |
| --- | --- |
| Methylene chloride | 188 |
| Hexaarylbiimidazole described in Ex. 1 | 1 |
| Dioctyl phthalate | 15 |
| Tris-(4-diethylamino-o-tolyl)methane | 0.5 |
| Poly(methyl methacrylate) described in Ex. 1 | 33.5 |

Results are found in Tables 1 and 2 below. This element, which had the same composition as the element used in Example 1 with the exception of the halogenated hydrocarbon, was nonconductive in its unexposed state and its rate of charge decay after exposure was insufficient to obtain a color image. This element had a charge half-life of 15.9 seconds after a 50 mj/cm$^2$ exposure to UV radiation. As a result of this slow charge decay, sufficient charge remained in the exposed areas of the element so that toner was attracted to both the unexposed and exposed areas, and no differentiation existed in the toned element between exposed and unexposed areas. On transfer to paper, the toner image was a solid mass of color and no dot image was obtained. In addition, the element did not change color after exposure to uv radiation.

CONTROL 2

A photosensitive element was prepared and evaluated as described in Example 1 with the following exception: the photosensitive layer had a coating weight of 115 mg/dm$^2$ and the following composition:

| INGREDIENT | WEIGHT (%) |
| --- | --- |
| Methylene chloride | 188 |
| 1,2-dibromotetrachloroethane | 0.5 |
| Dioctyl phthalate | 15 |
| Tris-(4-diethylamino-o-tolyl)methane | 0.5 |
| Poly(methyl methacrylate) described in Ex. 1 | 34 |

Results are found in Tables 1 and 2 below.

This element had the same composition as the element described in Example 1 with the exception of the hexaarylbiimidazole compound. This element had a charge half-life of 22.5 seconds after a 50 mj/cm$^2$ exposure to UV radiation. As a result of this slow charge decay, sufficient charge remained in the exposed areas of the element so that toner was attracted to both the unexposed and exposed areas, and no differentiation existed in the toned element between exposed and unexposed areas. On transfer to paper, the toner image was a solid mass of color and no dot image was obtained. In addition, the element did not change color after exposure to uv radiation.

TABLE 1

| SAMPLE | EXPOSED COLOR V (PEAK) | t½(sec) | UNEXPOSED V (PEAK) | t½(sec) | PRINT-OUT IMAGE |
| --- | --- | --- | --- | --- | --- |
| Control 1 | 215 | 15.9 | 217 | 202 | NO |
| Control 2 | 205 | 22.5 | 217 | 61.2 | NO |
| Example 1 | 110 | 0.9 | 220 | 54 | YES |
| Example 2 | 95 | 0.6 | 217 | 19.0 | YES |
| Example 3 | 190 | 2.8 | 218 | >30 | YES |
| Example 4 | 197 | 2.6 | 220 | >60 | YES |
| Example 5 | 140 | 1.2 | 220 | 76 | YES |

TABLE 2

| SAMPLE | DOT RANGE % | MIDTONE DOT GAIN % | DENSITY OF TONED TRANSFERRED Image |
|---|---|---|---|
| Control 1 | NO IMAGE; ALL BACKGROUND | | |
| Control 2 | NO IMAGE; ALL BACKGROUND | | |
| Example 1 | 2–98 | 15 | 1.36 |
| Example 2 | 2–99.5 | 4 | 1.78 |
| Example 3 | 2–98 | 16.5 | 1.53 |
| Example 4 | 2–97 | 19 | 1.66 |
| Example 5 | 2–97 | 15 | 1.46 |

EXAMPLE 6

A photosensitive element was prepared wherein the photosensitive layer having a coating weight of 86 mg/dm² had the following composition:

| INGREDIENT | WEIGHT (g) |
|---|---|
| Methylene chloride | 32 |
| Poly(methyl methacrylate) described in Ex. 1 | 5.3 |
| 2,2′,4,4′-tetrakis(o-chlorophenyl)-5,5′-bis(m,p-dimethoxyphenyl)biimidazole | 0.24 |
| Diethylene glycol dibenzoate | 2.3 |
| 4,4′-bis(diethylamino)benzophenone | 0.625 |
| Tris-(4-diethylamino-o-tolyl)methane | 0.08 |
| Trichloroacetamide | 0.125 |
| 1-phenyl-3-pyrazolidone | 0.002 |

The photosensitive composition was prepared by mixing the above ingredients, coating onto aluminized polyethylene terephthalate, 0.004 inch (0.0102 cm), using a doctor blade with a 0.003 inch (0.0076 cm) gap and evaporating the solvent by hot air drying for 90–120 seconds at 57°–65° C. A polypropylene cover sheet, 0.001 inch (0.0025 cm) was applied.

The photosensitive element was given a blanket exposure to 20 mj/cm² of energy (half the sample was covered and half was uncovered) using a Douthitt exposure unit with a Kokomo filter and a 5 KW photosensitive bulb. After exposure the polypropylene cover sheet was removed and the photosensitive element was initially charged to 800 volts, and the charge in the exposed area was measured 5 seconds after charging (V5). The rapid charge decay to almost zero volt (V5, Table 3 below) shows conductance in the exposed areas.

A known weight of the exposed photosensitive element was taken and dissolved in methylene chloride to make a 1 percent solution. The absorbance of the 1% solution at the peak absorbance wavelength (612 nm) was then measured. A 1 cm pathlength cell vs. a methylene chloride blank was used.

EXAMPLE 7

Four photosensitive elements were prepared and evaluated as described in Example 6 with the following exceptions: Samples 1,2,3 and 4 contained 1,1,1-trichloro-2-methyl-2-propanol, dichloroacetamide, iodoform, and 1,2-dibromotetrachloroethane, respectively, instead of trichloroacetamide. Sample 3 also contained 5.9 grams of polymethyl methacrylate instead of 5.3 grams and 1.71 grams of tris(2-butoxyethyl)phosphate instead of 2.3 grams of diethylene glycol dibenzoate. Results are found in Table 3 below.

TABLE 3

| EXAMPLE/ SAMPLE | V initial (volts) | V5 (volts) | PRINT OUT IMAGE | PEAK ABSORBENCE |
|---|---|---|---|---|
| 6 | 800 | 1 | YES | 2.69 |
| 7/1 | 800 | 2 | YES | 1.8 |
| 7/2 | 800 | 3 | YES | 1.18 |
| 7/3 | 800 | 2 | YES | 0.69 |
| 7/4 | 800 | 2 | YES | 2.24 |

Examples 6 and 7 illustrate five different halogenated compounds useful in this invention and the effectiveness of each halogenated compound to generate a print out image as measured by the peak absorbance of a 1% solution of the exposed photosensitive element.

EXAMPLE 8

A photosensitive element having a coating weight of 120 mg/dm² was prepared having a 0.004 inch (0.0102 cm) aluminized polyethylene terephthalate support, and a 0.00075 inch (0.002 cm) polypropylene coversheet. The photosensitive layer had the following composition:

| INGREDIENT | WEIGHT (g) |
|---|---|
| Methylene chloride | 2567 |
| Hexaarylbiimidazole described in Ex. 1 | 44 |
| 4,4′-bis(diethylamino)benzophenone | 6.6 |
| 1,2-dibromotetrachloroethane | 1.1 |
| 2-ethylhexyl benzyl phthalate | 352 |
| Tris-(4-diethylamino-o-tolyl)methane | 11 |
| 5,6-dimethoxy-2-(9′-julolidine)-1-indanone | 13.2 |
| Polyvinyl formal, weight average mol. wt. 16,000–20,000 | 22 |
| Poly(methyl methacrylate), inherent viscosity of 0.19 | 231 |
| Poly(methyl methacrylate), inherent viscosity of 1.3 | 419 |
| 1-phenyl-3-pyrazolidone | 0.22 |

The photosensitive element was prepared by mixing the above ingredients, coating onto aluminized polyethylene terephthalate support and evaporating the solvent by hot air drying for 45 seconds at 88° C. A 10 inch (25.4 cm)×25 inch (63.5 cm) element was exposed through a Dylux ® Clearing Filter (DCF), E. I. du Pont de Némours & Co., Wilm. Del., to filter out light of wavelengths shorter than 400 nm using the Berkey-Ascor exposure unit described above. Four exposures of 20, 30, 40, and 59 mj/cm² were made using this one element. The element darkened where it was exposed to light. After exposure, the coversheet was removed and the latent image was charged and developed as described in Example 1 above except the grid was operated at 315 volts and the element was toned 4.5 seconds after charging using the same magenta toner. The image was transferred to 60# Solitaire paper, Plainwell Paper Co., Plainwell, Mich., postwet with Isopar ®-L on the backside of the paper, and the image fused for 1 minute at 210° F. (98.9° C.). Results are shown in Table 4 below.

TABLE 4

| Exposure Energy (mj/cm²) | Dot Range (%) | Density | MidTone Dot Gain (%) |
|---|---|---|---|
| 20 | 2–98 | 1.33 | 14–18 |
| 30 | 2.5–99 | 1.43 | 13–14 |
| 40 | 2–98.5 | 1.34 | 13–15 |
| 59 | 3–99 | 1.33 | 9–11 |

This shows that the photosensitive element was sensitive to visible light, had high photospeed (low energy required for practical exposure) and gave images with full dot tonal range of at least 3–97% dots on a 150 lpi screen. A similarly prepared element having no visible sensitizer is somewhat sensitive to visible light, but requires six times more energy (120 mj/cm$^2$) to achieve the equivalent number of clear (untoned) steps on a square root of 2 neutral density stepwedge and print quality was poor having only a 5–97% dot tonal range.

EXAMPLE 9

Four photosensitive elements were prepared and evaluated as described in Example 1 with the following exceptions: the exposure was 40 mj/cm$^2$ instead of 50 mj/cm$^2$, the temperature and humidity were not measured, the coating weights as indicated were different, and a UGRA target was used in place of the Brunner target. The photosensitive layer of each element had the following composition:

| INGREDIENT | WEIGHT (%) | | | |
|---|---|---|---|---|
| SAMPLE | 1 | 2 | 3 | 4 |
| Methylene chloride | 188 | 188 | 188 | 188 |
| Poly(methyl methacrylate) described in Ex. 1 | 32.42 | 32.4 | 32.2 | 32.2 |
| Hexaarylbiimidazole described in Ex. 1 | 1 | 1 | 1 | — |
| 2,2',4,4'-tetrakis(o-chlorophenyl)-5,5'-bis(m,p-dimethoxyphenyl)biimidazole | — | — | — | 1 |
| Tris-(4-diethylamino-o-tolyl)methane | — | — | — | 0.5 |
| Leuco crystal violet | 0.33 | 0.33 | — | — |
| 9-diethylamino-12-(2-methoxycarbonylphenyl)-benz(a)-xanthene | — | — | 0.5 | — |
| 1,2-dibromotetrachloroethane | 0.25 | 0.25 | 0.25 | 0.25 |
| 2-ethylhexyl benzyl phthalate | 16 | 16 | 16 | 16 |
| 1-phenyl-3-pyrazolidone | — | 0.02 | 0.01 | 0 01 |

The coating weights in mg/dm$^2$ of Samples 1 to 4 are 110, 118, 211, 108, respectively.

Results are found in Table 5 below. All four elements gave print-out images.

TABLE 5

| EXAMPLE/ SAMPLE | OPTIMUM EXPOSURE (mj/cm$^2$) | DOT RANGE (%) | UN-EXPOSED t½ (sec) | EXPOSED (40 mj/cm$^2$) t½ (sec) |
|---|---|---|---|---|
| 9/1 | 18 | 2–98 | 6.8 | 0.8 |
| 9/2 | 35 | 2–97 | 137 | 1.3 |
| 9/3 | 34 | 3–98 | 102 | 1.6 |
| 9/4 | 24 | 2–98 | 28 | 0.9 |

EXAMPLE 10

A four color proof is obtained by following the steps described below. First, complementary registration marks are cut into the photosensitive layers of each of four electrostatic masters prior to exposure. Masters for each of the four color separations are prepared by exposing four photosensitive elements with or without coversheets over the photosensitive layer to one of the four color separation positives corresponding to cyan, yellow, magenta and black colors. Each of the four photosensitive layers is exposed using the Berkey-Ascor Exposure Unit described above. The visible radiation emitted by this source is suppressed by a UV light transmitting, visible light absorbing Kokomo® glass filter (No. 400, Kokomo Opalescent Glass Co., Kokomo, IN). The coversheets, if present, are removed, and each master is mounted on the corresponding color module drum, in a position assuring image registration of the four images as they are sequentially transferred from each master to the receiving paper. The leading edge clamps are also used to ground the master aluminized backplane to the drum. The masters are stretched by spring loading the trailing edge assuring that each lays flat against its drum.

Each module comprised a charging scorotron at 3 o'clock position, a developing station at 6 o'clock, a metering station at 7 o'clock and a cleaning station at 9 o'clock. The charging and developing procedure is similar to that described in Example 1. The transfer station consists of a tackdown roll, a transfer corona, paper loading, and a positioning device that fixes the relative position of paper and master in all four transfer operations.

In the preparation of the four-color proof the four developers, or toners, black, cyan, magenta and yellow, have the compositions described in Blanchet-Fincher et al. U.S. Pat. No. 4,818,660 column 21, lines 19 to 60, the disclosure of which is incorporated herein by reference.

First, the cyan master is charged, developed and properly metered. The transfer station is positioned and the toned cyan image transferred onto the paper. After the cyan transfer is completed, the magenta master is corona charged, developed and properly metered, and the magenta image transferred, in registry, on top of the cyan image. Afterwards, the yellow master is corona charged, developed, and properly metered, and the yellow image is transferred on top of the two previous images. Finally the black master is corona charged, developed, properly metered, and the toned black image transferred, in registry, on top of the three previously transferred images. After the procedure is completed, the paper is carefully removed from the transfer station and the image fused for 45 seconds at 100° C.

The parameters used for preparation of the proof are: drum speed, 2.2 inches/second (5.588 cm/second); grid scorotron voltage, 100 to 400 V; scorotron current 200 to 1000 microamps (5.11 to 6.04 kV); metering roll voltage, 20 to 200 V; tackdown roll voltage, −2.5 to −50 kV; transfer corona current, 50 to 150 microamps (4.35 to 4.88 kV); metering roll speed, 4 to 8 inches/seconds (10.16 to 20.32 cm/second); metering roll gap, 0.002 to 0.005 inch (0.0051 to 0.0127 cm); developer conductivity 10 to 30 picomhos/cm; developer concentration, 1 to 1.5% solids.

EXAMPLE 11

A photosensitive element having a coating weight of 125 mg/dm$^2$ was prepared having a 0.004 inch (0.0102 cm) aluminized polyethylene terephthalate support, and a 0.00048 inch (0.0012 cm) polyethylene terephthalate cover sheet. The photosensitive layer had the following composition:

| INGREDIENTS | AMOUNT (g) |
|---|---|
| Hexaarylbiimidazole described in Ex. 1 | 40 |
| 4,4'-bis(diethylamino)benzophenone | 6 |
| 2-mercaptobenzoxazole | 1 |
| 1,2-dibromotetrachloroethane | 5 |
| 2-ethylhexyl benzyl phthalate | 308 |
| Tris-(4-diethylamino-o-tolyl)methane | 10 |
| Poly(methyl methacrylate), inherent viscosity of 0.19 | 150 |

-continued

| INGREDIENTS | AMOUNT (g) |
|---|---|
| Poly(methyl methacrylate), inherent viscosity of 1.3 | 480 |
| 1-phenyl-3-pyrazolidone | 0.2 |
| Methylene chloride | 2277 |
| Propylene glycol methyl ether | 171 |

The photosensitive element was prepared by mixing the above ingredients, coating onto an aluminized polyethylene terephthalate support and evaporating the solvent at 80°–90° C. for about 1 minute. Two 10 inch (25.4 cm)×25 inch (63.5 cm) samples of the above element were exposed using a Model AEL1B Area Exposure Lamp, Fusion Uv Curing Systems, Rockville, Maryland, equipped with a "D" bulb and having a light intensity of 3 milliwatts/cm$^2$ at the center of the exposure vacuum frame set 34 inches (86.36 cm) above the light source. A vacuum was pulled for 60 seconds to achieve good contact between the photosensitive element and a UGRA PCW. One sample was exposed with the coversheet on and the other sample was exposed with the coversheet off. Exposure energies were 15 and 20 mj/cm$^2$. Exposure intensity and energy were measured with the IL1700 Research Radiometer described in Example 1 above. The films were charged and developed as described in Example 1 above except that the grid was operated at 315 volts and the element was developed 3.5 seconds after charging using the same magenta developer as described in Example 1. The image was transferred to 60# Adproof Paper, Appleton Paper Co., Appleton, Wis. postwet with Isopar ®-L and the image fused for 1 minute at 210° F. (98.9° C.). Results are shown in Table 6 below.

TABLE 6

| Exposure Energy (mj/cm$^2$) | Cover-Sheet | Dot Range (%) | Density | Midtone Dot Gain (%) |
|---|---|---|---|---|
| 15 | on | 1.6–97.6 | 1.30 | 10 |
| 20 | on | 1.5–97.2 | 1.40 | 9 |
| 15 | off | 1–97.8 | 1.31 | 10 |
| 40 | off | 1–97.8 | 1.34 | 11 |

This Example shows that a photosensitive element of the invention can be exposed without a coversheet to achieve closer contact between the photosensitive element and the color separation transparency to achieve higher resolution images.

CONTROL 3

A photosensitive element was prepared and evaluated as described in Example 1 with the following exceptions: the photosensitive layer had the following composition:

| INGREDIENTS | AMOUNT (g) |
|---|---|
| Hexaarylbiimidazole described in Ex. 1 | 2 |
| 1,2-dibromotetrachloroethane | 0.25 |
| 2-ethylhexyl benzyl phthalate | 15 |
| Poly(methyl methacrylate), inherent viscosity of 1.3 | 32.75 |
| Methylene chloride | 188 |

The cover sheet was polyethylene terephthalate having a thickness of 0.00048 inch (0.0012 cm), the temperature was 72° F. (22° C.) and the relative humidity was 45%.

The dry coating weight of the element was 137 mg/dm$^2$. The results of charging are shown in Table 7 below.

TABLE 7

| EXPOSED | | UNEXPOSED | | PRINT OUT |
|---|---|---|---|---|
| V(PEAK) | t½(sec), | V(PEAK) | t½(sec) | IMAGE |
| 215 | >270 | 222 | >300 | NO |

The element was non-conductive and remained non-conductive after exposure to 50 mj/cm$^2$ UV light as indicated by the long charge half-life (t ½) of more than 270 seconds, furthermore the exposed element had no print out image. This element demonstrates the need for a leuco dye in addition to a hexaarylbiimidazole photooxidant and the other ingredients.

We claim:

1. A high resolution, photosensitive electrostatic master which upon imagewise exposure forms conductive exposed image areas, the master comprising an electrically conductive substrate bearing a layer of a photosensitive composition consisting essentially of
   (A) at least one organic polymeric binder,
   (B) a hexaarylbiimidazole photooxidant,
   (C) a leuco dye that is oxidizable to an ionic species by the photooxidant,
   (D) a nonionic halogenated compound, and
   (E) a compatible plasticizer.

2. A photosensitive electrostatic master according to claim 1 wherein the photooxidant is a 2,2',4,4',5,5'-hexaarylbiimidazole.

3. A photosensitive electrostatic master according to claim 2 wherein the photooxidant is 2,2',4,4'-tetrakis(o-chlorophenyl)-5,5'-bis(m,p-dimethoxyphenyl)-biimidazole.

4. A photosensitive electrostatic master according to claim 2 wherein the photooxidant is 2,2'-bis(o-chlorophenyl)-4,4',5,5'-tetraphenylbiimidazole.

5. A photosensitive electrostatic master according to claim 1 wherein the polymeric binder is poly(methyl methacrylate).

6. A photosensitive electrostatic master according to claim 1 wherein the polymeric binder is cellulose acetate butyrate.

7. A photosensitive electrostatic master according to claim 1 wherein the polymeric binder is polystyrene.

8. A photosensitive electrostatic master according to claim 1 wherein the leuco dye is stabilized.

9. A photosensitive electrostatic master according to claim 8 wherein the stabilized leuco dye is tris-(4-diethylamino-o-tolyl)methane.

10. A photosensitive electrostatic master according to claim 8 wherein the stabilized leuco dye is 9-diethylamino-12-(2-methoxy-carbonylphenyl)-benz(a)xanthene.

11. A photosensitive electrostatic master according to claim 1 wherein the halogenated compound is a halogenated hydrocarbon selected from the group consisting of aromatic, aliphatic, alicyclic and combinations thereof.

12. A photosensitive electrostatic master according to claim 11 wherein the halogenated hydrocarbon is substituted by a member selected from the group consisting of oxygen, amine, amide, hydroxyl, nitrile and phosphate.

13. A photosensitive electrostatic master according to claim 11 wherein the halogenated hydrocarbon is 1,2-dibromotetrachloroethane.

14. A photosensitive electrostatic master according to claim 11 wherein the halogenated hydrocarbon is trichloroacetamide.

15. A photosensitive electrostatic master according to claim 1 wherein the compatible plasticizer is selected from the group consisting of dioctyl phthalate, triacetin, t-butylphenyl diphenyl phosphate, diethyleneglycol dibenzoate and 2-ethylhexyl benzyl phthalate.

16. A photosensitive electrostatic master according to claim 15 wherein the plasticizer is 2-ethylhexyl benzyl phthalate.

17. A photosensitive electrostatic master according to claim 1 wherein the conductive substrate is aluminized polyethylene terephthalate.

18. A photosensitive electrostatic master according to claim 1 wherein binder (A) is present in 40 to 85% percent, photooxidant (B) is present in 1 to 20 percent, leuco dye (C) is present in 0.5 to 40 percent, halogenated compound (D) is present in 0.25 to 10 percent and plasticizer (E) is present in 2 to 50 percent, the weight percentages based on the total weight of the photosensitive composition.

19. A photosensitive electrostatic master according to claim 1 wherein a visible sensitizer is present.

20. A photosensitive electrostatic master according to claim 19 wherein the visible sensitizer is an arylylidene aryl ketone.

21. A photosensitive electrostatic master according to claim 1 wherein a thermal stabilizer is present.

22. A photosensitive electrostatic master according to claim 21 wherein the thermal stabilizer is 1-phenyl-3-pyrazolidone.

23. A photosensitive electrostatic master according to claim 1 wherein the layer of photosensitive composition consists essentially of
(A) poly(methyl methacrylate),
(B) 2,2'-bis(o-chlorophenyl)-4,4',5,5'-tetraphenylbiimidazole
(C) tris-(4-diethylamino-o-tolyl)methane,
(D) 1,2-dibromotetrachloroethane, and
(E) 2-ethylhexyl benzyl phthalate.

24. A photosensitive electrostatic master according to claim 1 wherein over the photosensitive layer is a protective coversheet.

25. A xeroprinting process for making positive images by a single imagewise exposure comprising
(A) exposing imagewise to actinic radiation a photosensitive electrostatic master comprising an electrically conductive substrate bearing a layer of a photosensitive composition consisting essentially of
(A) at least one organic polymeric binder,
(B) a hexaarylbiimidazole photooxidant,
(C) a leuco dye that is oxidizable to an ionic species by the photooxidant,
(D) a nonionic halogenated compound, and
(E) a compatible plasticizer,
(B) charging the master electrostatically to form a latent image of electrostatic charge in the unexposed areas,
(C) developing the latent image by applying an oppositely charged electrostatic toner or developer, and
(D) transferring the toned or developed image to a receptor surface.

26. A process according to claim 25 wherein the actinic radiation is in the spectral range of 310 to 500 nm.

27. A process according to claim 25 wherein the source of actinic radiation is an ultraviolet/visible light.

28. A process according to claim 25 wherein the source of actinic radiation is an ultraviolet light emitting cathode ray tube.

29. A process according to claim 25 wherein the source of actinic radiation is an ultraviolet or visible light-emitting laser.

30. A process according to claim 25 wherein the source of actinic radiation is an electron beam.

31. A process according to claim 25 wherein the master is electrostatically charged by corona discharge.

32. A process according to claim 25 wherein the image is developed by means of a liquid electrostatic developer.

33. A process according to claim 32 wherein the liquid electrostatic developer consists essentially of a carrier liquid having a Kauributanol value of less than 30, present in major amount, thermoplastic resin particles having an average particle size of less than 10 μm, and a carrier liquid soluble ionic or zwitterionic charge director compound.

34. A process according to claim 25 wherein the image is developed by means of a dry electrostatic toner.

35. A process according to claim 25 wherein the toned image is transferred to a paper receptor.

36. A process according to claim 25 wherein the toned image is transferred to an insulating board.

37. A xeroprinting process for making positive images by a single imagewise exposure comprising
(A) exposing imagewise to ultraviolet/visible light source a photosensitive electrostatic master comprising an electrically conductive substrate bearing a layer of a photosensitive composition consisting essentially of
(A) at least one organic polymeric binder,
(B) a hexaarylbiimidazole photooxidant,
(C) a leuco dye that is oxidizable to an ionic species by the photooxidant,
(D) a nonionic halogenated compound, and
(E) a compatible plasticizer.
(B) charging the master by corona discharge to form a latent image of electrostatic charge in the unexposed areas,
(C) developing the latent image by applying an oppositely charged electrostatic toner or developer, and
(D) transferring the developed image to a paper receptor.

38. A process according to claim 37 wherein the layer of photosensitive composition consists essentially of
(A) poly(methyl methacrylate),
(B) 2,2'-bis(o-chlorophenyl)-4,4',5,5'-tetraphenylbiimidazole,
(C) tris-(4-diethylamino-o-tolyl)methane,
(D) 1,2-dibromotetrachloroethane, and
(E) 2-ethyl hexyl benzyl phthalate.

39. A process according to claim 37 wherein the liquid electrostatic developer consists essentially of a carrier liquid having a Kauributanol value of less than 30, present in major amount, thermoplastic resin particles having an average particle size of less than 10 μm, and a carrier liquid soluble ionic or zwitterionic charge director compound.

40. A process according to claim 38 wherein the liquid electrostatic developer consists essentially of a carrier liquid having a Kauributanol value of less than 30, present in major amount, thermoplastic resin particles having an average particle size of less than 10 μm, and a carrier liquid soluble ionic or zwitterionic charge director compound.

41. A process according to claim 37 wherein the image is developed by means of a dry electrostatic toner.

42. A process according to claim 25 wherein over the photosensitive layer is a protective coversheet which is removed prior to imagewise exposure.

* * * * *